United States Patent [19]

Mishima et al.

[11] Patent Number: 5,212,824
[45] Date of Patent: May 18, 1993

[54] MIXER FOR FREQUENCY CONVERTING BOTH GROUND AND SATELLITE BROADCASTING SIGNALS

[75] Inventors: Akira Mishima, Gifu; Kazuhiko Kubo, Osaka, both of Japan

[73] Assignee: Matsushita Electric Industrial Co., Ltd., Osaka, Japan

[21] Appl. No.: 625,763

[22] Filed: Dec. 13, 1990

[30] Foreign Application Priority Data

Dec. 13, 1989 [JP] Japan ................................ 1-323364

[51] Int. Cl.⁵ ............................................ H04B 1/16
[52] U.S. Cl. ................................ 455/188.1; 455/190.1; 455/330
[58] Field of Search ............... 455/330, 323, 333, 180, 455/188, 189, 190, 180.1, 180.4, 188.1, 189.1, 190.1; 329/358, 361

[56] References Cited

U.S. PATENT DOCUMENTS

| | | | |
|---|---|---|---|
| 4,002,986 | 1/1977 | Ma | 455/188 |
| 4,271,529 | 6/1981 | Strammello, Jr. | 455/188 |
| 4,485,488 | 11/1984 | Houdart | 455/330 |
| 4,534,062 | 8/1985 | Levinson | 455/330 |
| 4,633,188 | 12/1986 | Matsuta | 455/333 |
| 4,637,069 | 1/1987 | Charbonnier | 455/330 |
| 4,710,974 | 12/1987 | Kupfer | 455/190 |
| 4,998,293 | 3/1991 | Noboru | 455/330 |
| 5,006,811 | 4/1991 | Kruger | 455/333 |
| 5,014,349 | 5/1991 | Kubo et al. | 455/189 |

FOREIGN PATENT DOCUMENTS

| | | |
|---|---|---|
| 0193995A3 | 3/1986 | European Pat. Off. . |
| 0310222A2 | 7/1988 | European Pat. Off. . |
| 2561835A1 | 3/1984 | France . |
| 2025178A | 6/1979 | United Kingdom . |

OTHER PUBLICATIONS

"A Better Understanding Of Image Recovery Mixers", T. H. Oxley et al., (11th European Microwave Conference, 7-11 Sep. 1981, Amsterdam (NL), Sevenoaks (GB), pp. 197-202.

Primary Examiner—Reinhard J. Eisenzopf
Assistant Examiner—Edward Urban
Attorney, Agent, or Firm—Wenderoth, Lind & Ponack

[57] ABSTRACT

A mixer for use in a double superheterodyne tuner which can receive either ground broadcasting channels or the satellite broadcasting channels is provided with frequency mixing diodes for the ground broadcasting signal and frequency mixing diodes for the satellite broadcasting signal. Switching diodes are provided between each of the frequency mixing diodes and output terminals of a balun transformer having an input terminal for receiving a local oscillation signal. When the ground broadcasting signal is received, the switching diodes connected to the frequency mixing diodes of the ground broadcasting are turned ON, with the switching diodes connected to the frequency mixing diodes of the satellite broadcasting are turned OFF, so that the leakage of the local oscillation signal to the satellite broadcasting signal when the ground broadcast signal is received is greatly reduced.

4 Claims, 2 Drawing Sheets

MIXER FOR FREQUENCY CONVERTING BOTH GROUND AND SATELLITE BROADCASTING SIGNALS

BACKGROUND OF THE INVENTION

1. Field of the Invention

The present invention relates to a mixer for changing the frequency of a tuning signal in a television set which can receive both ground and satellite broadcasting signals.

2. Description of the Prior Art

A conventional mixer of the type referred to above has been constituted in such a structure such as that in FIG. 1. The mixer shown has a balun transformer T which has an input terminal A connected to a local oscillator, and a middle tap and one end of an unbalanced terminal grounded. The mixer also includes a terminal B which serves not only as an input terminal of a high frequency signal, but also as an output terminal of an intermediate frequency signal of both ground and satellite broadcasting signals, and diodes 13 and 14 for mixing frequencies. Nowadays, a ground broadcast signals can be received by a double superheterodyne tuner whereby the frequency of an input high frequency signal is changed to the 960 MHz band by a first frequency converting unit and then to a 58 MHz band by a second frequency converting unit. The mixer (first mixer) shown in FIG. 1 is used to change the input frequency to 960 MHz band.

The above-mentioned double superheterodyne tuner can receive ground broadcast and satellite broadcast signals, as well will be described with reference to FIG. 2.

In FIG. 2, a terminal E receives the ground broadcasting signal which is supplied to input bandpass filters 21, 22 and 23 which are respectively for VHF, CATV and UHF bands. The signal passing through one of these band-pass filters 21-23 is amplified by a wide-band amplifier 24 and input to a first mixer 25. The amplified signal is mixed in the first mixer 25 with a first local oscillation signal of a first local oscillator 26. Then, the difference component is output from the first mixer 25 as a first intermediate frequency signal (960 MHz band). The first intermediate frequency signal is amplified by a first IF amplifier 27. Only the first intermediate frequency signal passes through the bandpass filter 28 and is input to a second mixer 29, where the first intermediate frequency signal is mixed with a second local oscillation signal of a second local oscillator 30. The difference component is output from the second mixer 29 as a second intermediate frequency signal which passes through a second IF amplifier 31, and a second IF signal is produced from a terminal F.

A tuning voltage is supplied to the first local oscillator 26 from a terminal I. The first local oscillation signal of the first local oscillator 26 is frequency-divided by a pre-scaler 34, and the frequency-divided output is fed to a station selecting circuit (not shown) from a terminal J.

A terminal G is for the satellite broadcasting signal, and receives a signal (1.0-1.3 GHz) which has been changed to a first intermediate frequency at the preceding stage. Only the frequency of the satellite broadcast signal is allowed to pass through the input filter 32 to a switching circuit 37 via a first IF amplifier 33.

The switching circuit 37 changes its position so as to select and supply either the ground broadcasting or the satellite broadcasting signal to the first mixer 25. The second switching circuit 38 functions similarly to the first switching circuit 37, outputting the ground broadcasting signal to the first IF amplifier 27 and the satellite broadcasting signal to a second IF amplifier 35. An output signal from the first IF amplifier 33 is mixed with an input signal from the local oscillator 26 by the first mixer 25 which in turn generates the difference components (403 MHz) as a second IF signal. The second IF signal of 400 MHz is, after passing through the switching circuit 38 and the second IF amplifier 35, demodulated by an FM demodulator 36 and output to a terminal H. Therefore, the first mixer 25, first local oscillator 26 and pre-scaler 34 are used in common for both the ground and satellite broadcasting signals.

In the structure shown in FIGS. 1 and 2, the first local oscillation frequency when the ground broadcasting signal is received is 1050-1420 MHz, while the first intermediate frequency when the satellite broadcast is received is 1036-1331 MHz, resulting in overlapping of the band regions. In such an overlapping case, since the terminal B of FIG. 1 serves as a common input terminal for both the ground broadcasting and satellite broadcasting signals, there arises such a problem that, when the ground broadcasting signal is received by a first television set, the first intermediate frequency, i.e., 1036-1331 MHz of the satellite broadcasting signal received by a second television set having a common source line with the first television set is disturbed by the local oscillation signal from the first television set. This can be understood such that, since the satellite broadcasting signal is in an FM system with little input power, the satellite broadcasting signal is susceptible to the leakage signal from the local oscillation signal. More specifically, for example, when a television set A of a first subscriber of the CATV system is tuned to a ground broadcasting channel and a television set B of a second subscriber of the CATV system is tuned to a satellite broadcasting channel, the local oscillation signal from the television set A is transmitted through the cable to the television set B resulting in the disturbance of the satellite broadcasting signal.

SUMMARY OF THE INVENTION

An essential object of the present invention is to provide a mixer which can reduce greatly the leakage of a local oscillation signal when the ground broadcast is received.

In accomplishing the above-described object, the mixer of the present invention comprises a balun transformer having a middle point, first and second unbalanced terminals, and first and second balanced terminals, said middle point and second unbalanced terminals grounded, and said first unbalanced terminal so connected to receive a local oscillation signal; first and second capacitors having ends respectively connected to said first and second balanced output terminals; first and second grounding resistors connected to other ends of said first and second capacitors; first and second diodes having cathodes connected in common to said other end of said first capacitor; third and fourth diodes having cathodes connected in common to said other end of said second capacitor; said first and third diodes connected through a first regulating resistor means to a first control terminal; third and fourth capacitors connected, respectively, to anodes of said first and third diodes; fifth and sixth diodes connected forwardly in series between said third and fourth capacitors; a first output terminal at a junction between said fifth and sixth diodes; said second and fourth diodes connected through second regulating resistor means to a second control terminal; fifth and sixth capacitors connected, respectively, to anodes of said second and fourth diodes; seventh and eighth diodes connected forwardly in series between said fifth and sixth capacitors; and a second output terminal at a junction between said seventh and eighth diodes.

In the above-described constitution of the mixer, the first output terminal serves as an input terminal of a high frequency ground broadcasting signal and as an output terminal of the converted high frequency signal in the 960 MHz band, while the second output terminal serves as an input terminal of the satellite broadcasting high frequency signal (which signal becomes a first intermediate frequency in 1036–1331 MHz band when the satellite broadcast is received) and an output terminal of a second intermediate frequency satellite broadcasting signal.

Thus, the input terminals are made separate between the ground and satellite broadcasting signals, so that the leakage of a local oscillation signal to the satellite broadcasting signal is greatly reduced when the ground broadcast signal is received.

BRIEF DESCRIPTION OF THE DRAWINGS

This and other objects and features of the present invention will become apparent from the following description taken in conjunction with a preferred embodiment thereof with reference to the accompanying drawings, in which.

DESCRIPTION OF ONE PREFERRED EMBODIMENT

Figure 1:
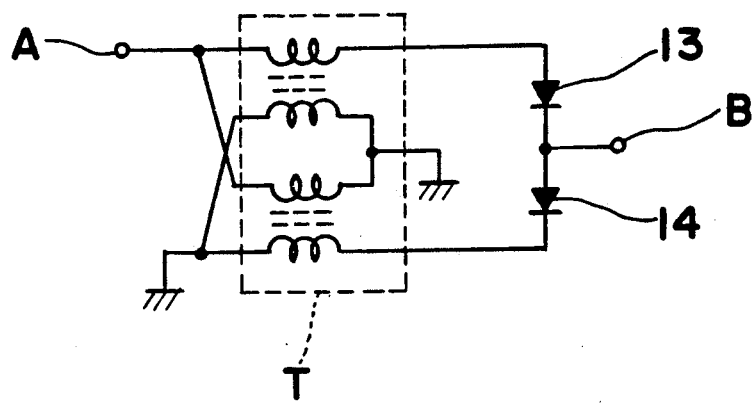
FIG. 1 is a circuit diagram of a conventional mixer.
Figure 3:
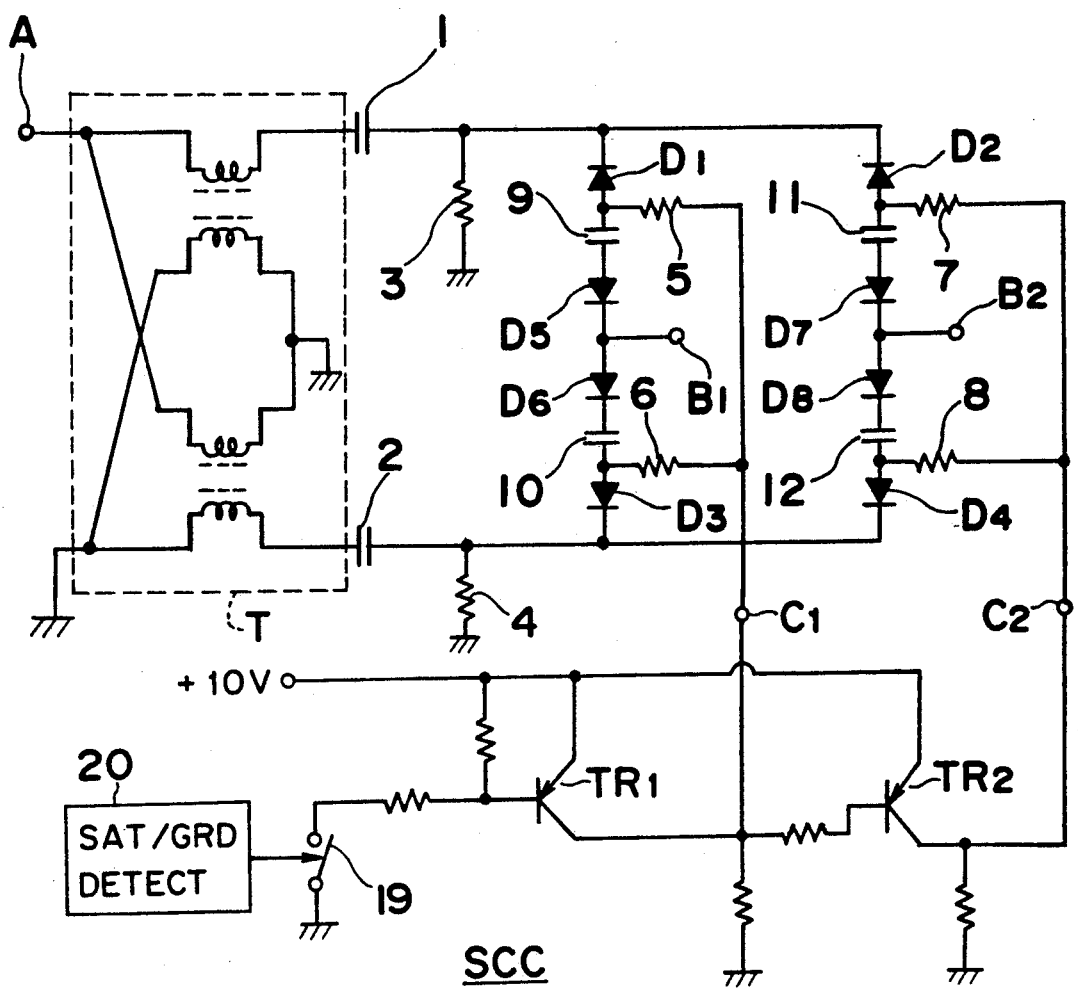
FIG. 3 is a circuit diagram of a mixer according to a preferred embodiment of the present invention which can be employed in the tuner of FIG. 2.

Referring to FIG. 3, a mixer of the present invention is shown which has: an input terminal A for a signal from a local oscillator; a balun transformer T with a middle point and one end of an unbalanced terminal connected to ground; capacitors 1, 2 and 9–12 for cutting DC currents; switching diodes D1–D4; and mixing diodes D5–D8 for mixing frequencies.

Figure 2:
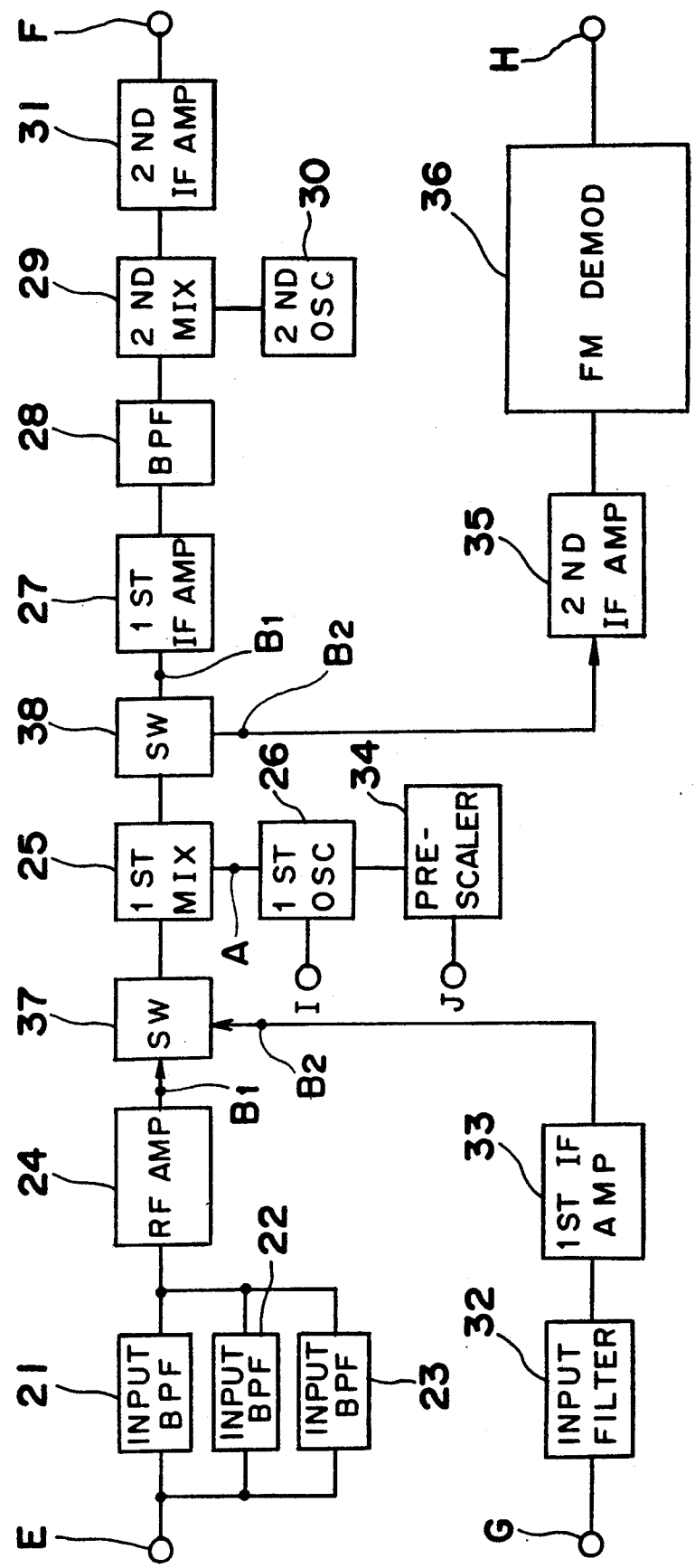
FIG. 2 is a block diagram of a double superheterodyne tuner of a known type capable of receiving both the ground and the satellite broadcasting signal.

When the mixer shown in FIG. 3 is to be accommodated in the tuner of FIG. 2, circuits 37, 38 and 25 are replaced with the mixer of FIG. 3 such that input terminal A is connected to the first local oscillator 26, terminal B1 between diodes D5 and D6 is connected to both RF amplifier 24 and first IF amplifier 27, and terminal B2 between diodes D7 and D8 is connected to both first IF amplifier 33 and second IF amplifier 35.

First and second controlling terminals C1 and C2 are connected to a selection control circuit SCC including transistors TR1 and TR2 and a switch 19 coupled to a satellite/ground broadcasting detector 20. The detector 20 is, for example, connected to a channel selector (not shown) to detect whether the channel selected by the operator is a satellite broadcasting channel or a ground broadcasting channel. When the satellite/ground broadcasting detector 20 detects that satellite broadcasting is being received, detector 20 turns off the switch 19 to turn transistor TR1 off and transistor TR2 on. Thus, a predetermined voltage, such as +10 V, from a voltage source (not shown) is supplied to the second controlling terminal C2 and 0 V is supplied to the first controlling terminal C1. On the contrary, when detector 20 detects that ground broadcasting is being received, detector 20 turns on the switch 19 to turn transistor TR1 on and transistor TR2 off. Thus, the predetermined voltage is supplied to the first controlling terminal C1 and 0 V is supplied to the second controlling terminal C2.

The first controlling terminal C1 receives +10 V or 0 V to turn ON or OFF, respectively, the switching diodes D1 and D3 through resistors 3–6. The terminal B1 serves as an input terminal of the ground broadcasting high frequency signal and also as an output terminal of a signal having the frequency converted to 960 MHz band. The second controlling terminal C2 receives +10 V or 0 V to turn ON or OFF the switching diodes D2 and D4 via resistors 3, 4, 7 and 8. The terminal B2 serves as an input terminal of the satellite broadcasting high frequency signal (which signal becomes a first intermediate frequency, 1036–1331 MHz band, when the satellite broadcasting signal is received) and also as an output terminal of a second intermediate frequency signal of the satellite broadcasting.

The connections of the terminals with respect to the circuit components will be described in more detail below.

The first and second capacitors 1 and 2 are connected to balanced terminals of the balun transformer T which has a middle point and one end of the unbalanced terminal grounded. The other end of the unbalanced terminal is connected to the input terminal A for receiving the local oscillation signal. Moreover, the capacitors 1 and 2 are connected at the other ends thereof to the resistors 3 and 4 which have respective ends grounded. Cathodes of the first and second diodes D1 and D2 are connected to the first capacitor 1 at the other end thereof than where the capacitor C1 is connected to the balanced terminal of the balun transformer T, and cathodes of the third and fourth diodes D3 and D4 are connected to the second capacitor 2 at the other end thereof.

The anodes of the first and third diodes D1 and D3 are connected to resistors 5 and 6, respectively. The other ends of the resistors 5 and 6 are connected to the first controlling terminal C1. Furthermore, the anodes of the first and third diodes D1 and D3 are connected to one ends of the capacitors 9 and 10, respectively. Two diodes D5 and D6 are connected in series in a forward direction between the other ends of the capacitors 9 and 10. A junction between the two diodes D5 and D6 is connected to the first signal terminal B1.

Similarly, anodes of the second and fourth diodes D2 and D4 are connected to one ends of resistors 7 and 8, respectively. The other ends of the resistors 7 and 8 are connected to the second controlling terminal C2. Moreover, the anodes of the second and fourth diodes D2 and D4 are connected to capacitors 11 and 12. Diodes D7 and D8 are connected in series in a forward direction between the other ends of the capacitors 11 and 12. A junction between the diodes D7 and D8 is connected to the second signal terminal B2.

As mentioned earlier, the first signal terminal B1 serves as an input terminal of the ground broadcasting high frequency signal and also as an output terminal of the signal having the frequency converted to 960 MHz band. On the other hand, the second signal terminal B2 serves as an input terminal of the satellite broadcast high frequency signal and also as an output terminal of the second intermediate frequency signal of the satellite broadcasting.

When the ground broadcasting signal is received, switch 19 closes to turn transistor TR1 and TR2 ON and OFF, respectively, to provide HIGH (10 V) and LOW (0 V) level signals to terminals C1 and C2. Thus, the switching diodes D1 and D3 are turned ON by +10 V applied to the first controlling terminal C1, while the switching diodes D2 and D4 are turned OFF by 0 V applied to the second controlling terminal C2. Diodes D5 and D6 are for mixing the frequencies. At this time, since the switching diodes D2 and D4 and frequency mixing diodes D7 and D8 are maintained OFF, the local oscillation signal is prevented from being transmitted to the input terminal B2. As a result, the leakage of the local oscillation signal to the input terminal B2, which is for the satellite broadcasting high frequency signal, is reduced greatly.

The resistors 3–8 are for providing DC bias voltage to the active signal and are set to have a sufficiently high impedance to the signal. Therefore, if a sufficiently high impedance is secured with respect to the high frequency signal, a series circuit consisting of a resistor and a choke coil or a choke coil alone will do in place of the resistors 3–8.

Furthermore, the capacitors 1 and 2 and resistances 3 and 4 can be deleted, provided that switching diodes D1-D4 are turned ON and OFF completely by a positive or negative controlling voltage from terminals C1 and C2. Moreover, the diodes D1-D4 may be connected inversely in polarity.

When the television set is receiving the satellite broadcasting signal, switch 19 opens to turn transistors TR1 and TR2 OFF and ON, respectively. Thus, the mixer of FIG. 3 receives 0 V to the first controlling terminal C1 and 10 V to the second controlling terminal C2. Thus, the switching diodes D2 and D4 turn ON. Consequently, the mixing diodes D7 and D8 operate to mix the frequencies. In this case the switching diodes D1 and D3 for the ground broadcasting signal are maintained OFF.

As is made clear from the above, since the input terminals are provided separately for the ground and satellite broadcastings according to the present invention, it is possible to greatly reduce the leakage of the local oscillation signal to the input terminal of the satellite broadcasting signal.

Although the present invention has been fully described by way of example with reference to the accompanying drawings, various changes and modifications would be apparent to those skilled in the art. Such changes and modifications are to be understood as being defined by the appended claims unless they depart therefrom.

What is claimed is:

1. A mixer comprising:
   a balun transformer having an input terminal for receiving a local oscillation signal and first and second output terminals;
   first and second switching diodes connected in series between said first and second out terminals of said balun transformer;
   third and fourth switching diodes connected in series between said first and second output terminals of said balun transformer and in parallel to said first and second switching diodes;
   first and second frequency mixing diodes inserted in series between said first and second switching diodes;
   third and fourth frequency mixing diodes inserted in series between said third and fourth switching diodes;
   a detecting means for detecting a selected channel between a satellite broadcasting channel and a ground broadcasting channel;
   a first control means for simultaneously turning said first and second switching diodes OFF and ON with respect to the direction of the satellite broadcasting channel and ground broadcasting channel, respectively;
   a second control means for simultaneously turning said third and fourth switching diodes ON and OFF with respect to the detection of the satellite broadcasting channel and ground broadcasting channel, respectively;
   a first input/output terminal means connected to a junction between said first and second frequency mixing diodes for receiving signals of a first frequency and for outputting signals of a second frequency; and
   a second input/output terminal means connected to a junction between said third and fourth frequency mixing diodes for receiving signals of a third frequency and for outputting signals of a fourth frequency.

2. A mixer as claimed in claim 1, wherein said first input/output terminal serves as an input terminal of a ground broadcasting high frequency signal and also as an output terminal of a converted high frequency signal, and wherein said second input/output terminal serves as an input terminal of a satellite broadcasting high frequency signal and also as an output terminal of a second intermediate frequency signal of the satellite broadcasting signal.

3. A mixing comprising:
   a balun transformer having a middle portion, first and second unbalanced terminals, and first and second balanced terminals, said middle point and second unbalanced terminals being grounded, and said first unbalanced terminal being connected so as to receive a local oscillation signal;
   first and second capacitors having one end respectively connected to said first and second balanced output terminals;
   first and second grounding resistors respectively connected to other ends of said first and second capacitors;
   first and second diodes having cathodes connected in common to said other end of said first capacitor;
   third and fourth diodes having cathodes connected in common to said other end of said second capacitor;
   said first and second diodes connected through a first regulating resistor means to a first control terminal;
   third and fourth capacitors respectively connected to anodes of said first and second diodes;
   fifth and sixth diodes respectively connected forwardly in series between said third and fourth capacitors;
   a first input/output terminal disposed at a junction between said fifth and sixth diodes for receiving input signals of a first frequency and for outputting signals of a second frequency;

said third and fourth diodes connected through a second regulating resistor means to a second control terminal;

fifth and sixth capacitors respectively connected to anodes of said third and fourth diodes;

seventh and eighth diodes respectively connected forwardly in series between said fifth and sixth capacitors; and a second input/output terminal disposed at a junction between said seventh and eighth diodes for receiving signals of a third frequency and for signals of a fourth frequency.

4. A mixer as claimed in claim 3, further comprising:

a detecting means for detecting a selected channel between a satellite broadcasting channel and a ground broadcasting channel;

first control means for providing LOW and HIGH level signals to said first control terminal in response to the detection of said satellite broadcasting channel and said ground broadcasting channel, respectively; and second control means for providing HIGH and LOW level signals to said second control terminal in response to the detection of said satellite broadcasting channel and said ground broadcasting channel, respectively.

* * * * *